(12) United States Patent
Takano

(10) Patent No.: US 9,997,390 B2
(45) Date of Patent: Jun. 12, 2018

(54) SEMICONDUCTOR MANUFACTURING METHOD AND LAMINATED BODY

(71) Applicant: Toshiba Memory Corporation, Minato-ku (JP)

(72) Inventor: Eiji Takano, Oita (JP)

(73) Assignee: TOSHIBA MEMORY CORPORATION, Minato-ku (JP)

(*) Notice: Subject to any disclaimer, the term of this patent is extended or adjusted under 35 U.S.C. 154(b) by 0 days. days.

(21) Appl. No.: 15/064,941

(22) Filed: Mar. 9, 2016

(65) Prior Publication Data
US 2016/0276201 A1    Sep. 22, 2016

(30) Foreign Application Priority Data
Mar. 17, 2015  (JP) .................................. 2015-053890

(51) Int. Cl.
  *H01L 21/78* (2006.01)
  *H01L 21/768* (2006.01)
  *H01L 21/683* (2006.01)

(52) U.S. Cl.
  CPC ...... *H01L 21/6835* (2013.01); *H01L 21/6836* (2013.01); *H01L 21/78* (2013.01); *H01L 21/76898* (2013.01); *H01L 2221/6834* (2013.01); *H01L 2221/68327* (2013.01); *H01L 2221/68368* (2013.01); *H01L 2221/68381* (2013.01)

(58) Field of Classification Search
  CPC .............. H01L 21/6835; H01L 21/78; H01L 21/76898; H01L 2221/6831; H01L 2221/68327; H01L 21/6836; H01L 21/7688; H01L 2221/6834; H01L 2221/68381
  See application file for complete search history.

(56) References Cited

U.S. PATENT DOCUMENTS

| 8,800,631 | B2 | 8/2014 | Noda et al. | |
|---|---|---|---|---|
| 2006/0118515 | A1* | 6/2006 | Dolechek | H01L 21/6835 216/52 |
| 2009/0065051 | A1* | 3/2009 | Chan | H01L 31/18 136/256 |
| 2010/0264566 | A1* | 10/2010 | Moore | H01L 21/6835 264/401 |
| 2011/0012214 | A1* | 1/2011 | Beer | B81C 1/00333 257/418 |
| 2012/0058623 | A1* | 3/2012 | Hsieh | H01L 21/304 438/459 |
| 2015/0235871 | A1* | 8/2015 | Akiba | H01L 21/67126 438/113 |

FOREIGN PATENT DOCUMENTS

| JP | 11-150090 A | 6/1999 |
|---|---|---|
| TW | 200917353 A | 4/2009 |
| TW | 201220425 A1 | 5/2012 |

\* cited by examiner

*Primary Examiner* — Caridad Everhart
(74) *Attorney, Agent, or Firm* — Oblon, McClelland, Maier & Neustadt, L.L.P.

(57) ABSTRACT

A semiconductor manufacturing method according to a present embodiment includes forming a supporter on a second surface of a semiconductor substrate opposite to a first surface to be ground of the semiconductor substrate. The semiconductor manufacturing method includes thinning the thickness of the semiconductor substrate by grinding the first surface. In the semiconductor manufacturing method, the supporter contains a resin.

19 Claims, 4 Drawing Sheets

SEMICONDUCTOR MANUFACTURING METHOD AND LAMINATED BODY

CROSS REFERENCE TO RELATED APPLICATIONS

This application is based upon and claims the benefit of priority from the prior Japanese Patent Application No. 2015-53890, filed on Mar. 17, 2015, the entire contents of which are incorporated herein by reference.

FIELD

An embodiment of the present invention relates to a semiconductor manufacturing method and a laminated body.

BACKGROUND

Conventionally, in a semiconductor manufacturing process, after a wafer is processed in an upstream process (wafer process), the thickness of a wafer has been reduced (hereinafter, also referred to as thinning) in a downstream process for housing into a package. Thinning has been carried out in a state in which the wafer is temporarily bonded onto a supporting substrate by an adhesive agent. Then, after thinning, the supporting substrate is peeled off from the wafer, and the adhesive agent is removed from the surface of the wafer.

Moreover, conventionally, supporting substrates made of glass or made of silicon have been used. The supporting substrates made of glass or made of silicon are expensive and, therefore, are reused for thinning of a new wafer after used for thinning one wafer.

However, conventionally, since an environment and a process for reusing supporting substrates have to be build, the cost cannot be sufficiently suppressed even if the supporting substrates are reused. Moreover, conventionally, removal of the adhesive agent from a wafer has been carried out by peeling or cleaning using a solvent. However, in peeling, since an adhesive agent residue is generated after peeling, there has been a problem of the deterioration of yield. Moreover, in the cleaning using the solvent, since the usage amount of the solvent is large, there have been a problem of high cost and a problem of long cleaning time.

Therefore, it is desirable to carry out thinning of a semiconductor substrate at low cost while ensuring productivity.

DETAILED DESCRIPTION

A semiconductor manufacturing method according to a present embodiment includes forming a supporter on a second surface of a semiconductor substrate opposite to a first surface to be ground of the semiconductor substrate. The semiconductor manufacturing method includes thinning the thickness of the semiconductor substrate by grinding the first surface. In the semiconductor manufacturing method, the supporter contains a resin.

Embodiments will now be explained with reference to the accompanying drawings. The present invention is not limited to the embodiments.

Figure 1:
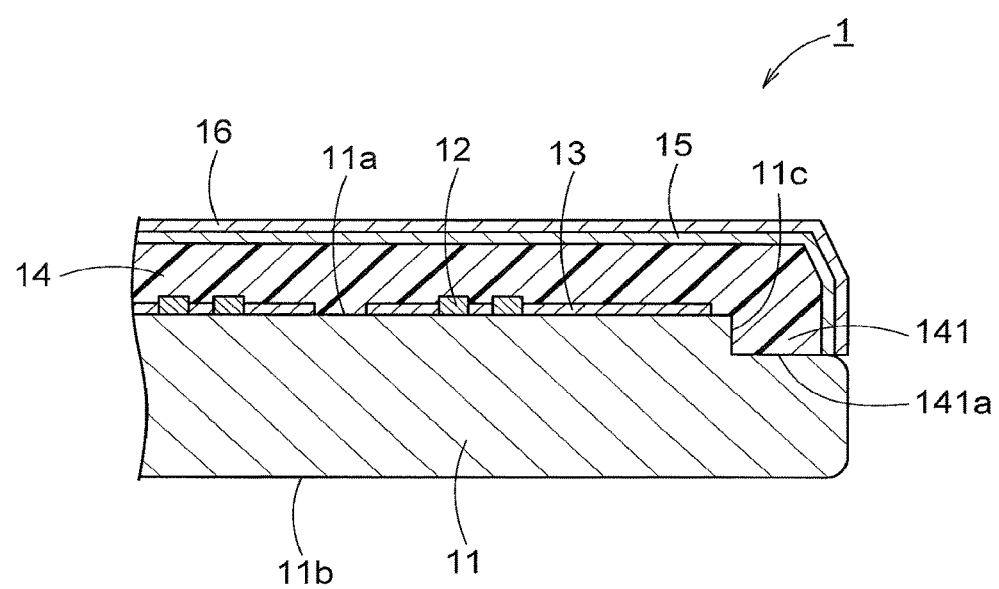
FIG. 1 is a schematic cross-sectional view of a laminated body 1 showing a present embodiment.

FIG. 1 is a schematic cross-sectional view of a laminated body 1 showing the present embodiment. As shown in FIG. 1, the laminated body 1 is provided with a semiconductor wafer (including a semiconductor substrate 11, pad electrodes 12 (second electrodes) and a passivation film 13), a supporter 14, an electrically-conductive film 15, and a protective film 16.

The semiconductor substrate 11 is, for example, a silicon substrate. A front surface 11a (upper surface in FIG. 1) of the semiconductor substrate 11 is a device surface (second surface) on which unshown devices such as semiconductor elements are formed. On the other hand, a back surface 11b (lower surface in FIG. 1) of the semiconductor substrate 11 is a grinding target surface (first surface) to be ground in thinning of the semiconductor substrate 11.

The pad electrodes 12 are in contact with the front surface 11a of the semiconductor substrate 11. Specifically, the pad electrodes 12 are electrically connected to the devices formed on the front surface 11a of the semiconductor substrate 11. Moreover, in order to carry out three-dimensional packaging after individually separating the semiconductor substrate 11, the pad electrodes 12 are electrically connected to later-described through silicon vias. The pad electrodes 12 may be, for example, Cu electrodes.

The passivation film 13 is in contact with the front surface 11a of the semiconductor substrate 11 between the pad electrodes 12. The passivation film 13 insulates the pad electrodes 12 from each other. The passivation film 13 is, for example, a SiN film. The passivation film 13 may further contain $SiO_2$ and/or a polyimide resin.

The supporter 14 is entirely coating the front surface 11a of the semiconductor substrate 11 in a layer above the pad electrodes 12 and the passivation film 13. In a case of processing (for example, thinning, formation of the through silicon vias, dicing, etc.) of the semiconductor substrate 11, the supporter 14 supports the semiconductor substrate 11. More specifically, the supporter 14 reinforces the semiconductor substrate 11 so that damage such as a crack is not generated on the semiconductor substrate 11 in the case of processing of the semiconductor substrate 11.

The supporter 14 is a resin layer obtained by curing a curable resin. The curable resin may be either one of a thermo-setting resin and an ultraviolet curable resin. Since the supporter 14 is a resin layer, the supporter 14 can be manufactured at low cost. Moreover, after the processing of the semiconductor substrate 11, the supporter 14 can be removed at low cost without deteriorating a yield. Moreover, dicing of the semiconductor substrate 11 can be simplified.

Note that, as shown in FIG. 1, the front surface 11a at an end of the semiconductor substrate 11 may be depressed because of unevenness. In addition, as shown in FIG. 1, an end 141 of the supporter 14 may be in contact with the depressed front surface 11a. More specifically, the end 141 of the supporter 14 may be projecting toward the semiconductor substrate 11 side so as to coat a lateral surface 11c and the front surface 11a of the semiconductor substrate 11. Since the end 141 of the supporter 14 coats the lateral surface 11c of the semiconductor substrate 11, generation of a burr(s) at the end of the semiconductor substrate 11 in the case of thinning of the semiconductor substrate 11 can be suppressed.

The electrically-conductive film 15 is entirely coating a surface of the supporter 14. The electrically-conductive film 15 can be used for electrostatically chucking the semiconductor substrate 11 in a case of processing of the semiconductor substrate 11. The electrically-conductive film 15 may be a metal thin film.

The protective film 16 entirely coats a surface of the electrically-conductive film 15. The protective film 16 protects the surface of the supporter 14. The protective film 16 may be, for example, a resin film.

According to the laminated body 1 of the present embodiment, since the supporter 14 contains the resin, the semiconductor substrate 11 can be supported at low cost compared with a supporting substrate made of glass or made of silicon. Moreover, since the supporter 14 can be directly provided on the semiconductor substrate 11, the adhesion residue generated in a case in which a semiconductor substrate is bonded to a supporting substrate with an adhesive agent is not generated. Moreover, an adhesive-agent peeling step, which is required in the case in which the semiconductor substrate is bonded to the supporting substrate with the adhesive agent, can be omitted.

Therefore, according to the laminated body 1 of the present embodiment, thinning of the semiconductor substrate 11 can be carried out at low cost while ensuring productivity (yield, manufacturing efficiency).

Figure 2A:
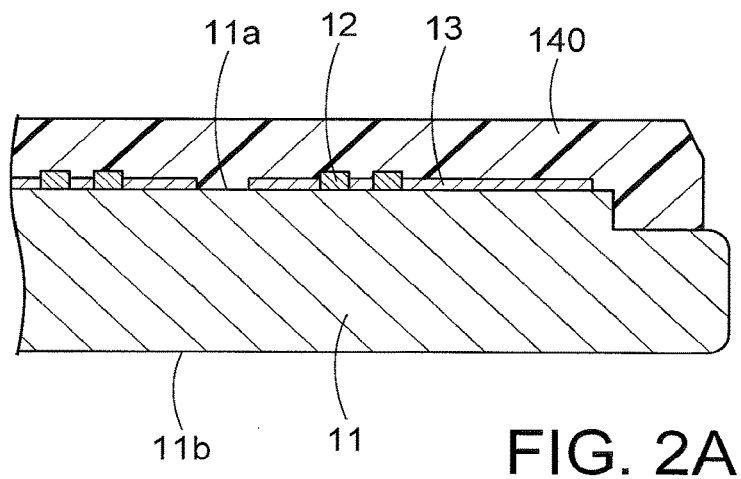
FIG. 2A to FIG. 2C are schematic cross-sectional views of a semiconductor manufacturing method showing the present embodiment.
Figure 2B:
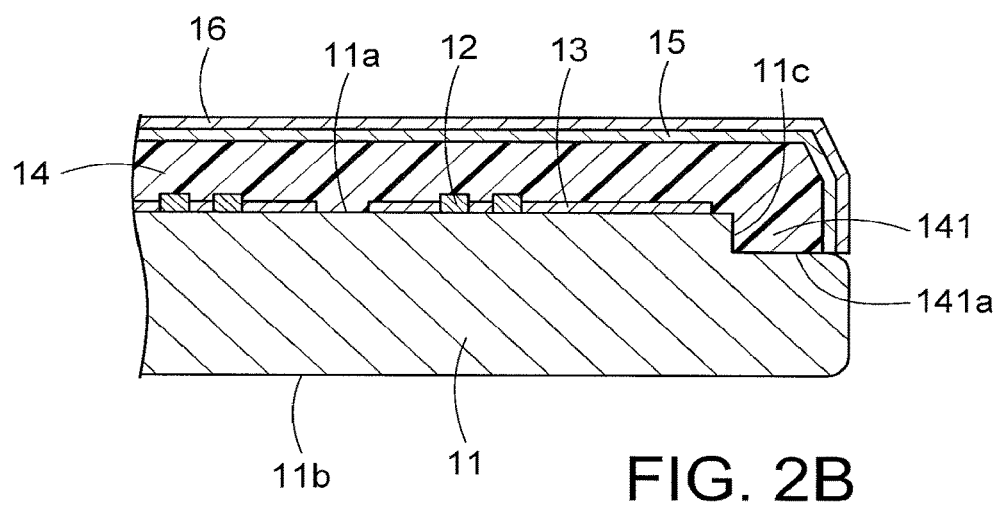
Figure 2C:
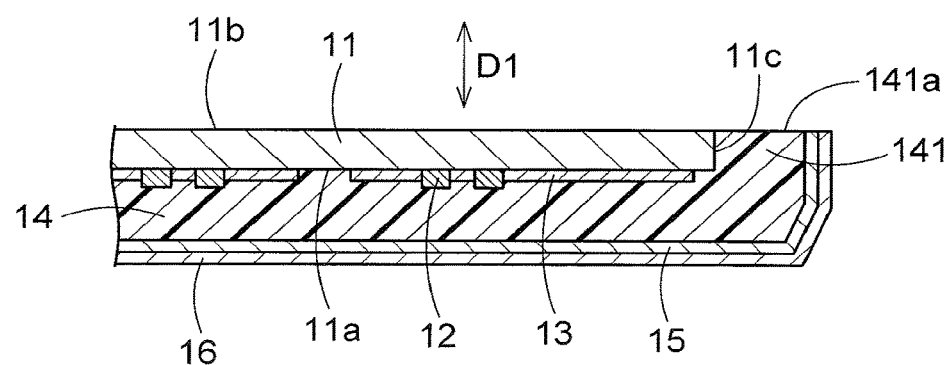

Next, a semiconductor manufacturing method of the present embodiment provided with manufacturing steps of the laminated body 1 of FIG. 1 will be explained. FIG. 2A to FIG. 2C are schematic cross-sectional views of the semiconductor manufacturing method showing the present embodiment. Specifically, FIG. 2A is a drawing showing a step of forming the supporter 14. FIG. 2B is a drawing showing a step of forming the electrically-conductive film 15 and the protective film 16. FIG. 2C is a drawing showing a step of thinning the semiconductor substrate 11.

Note that, in an initial state, it is assumed that the pad electrodes 12 and the passivation film 13 are formed on the front surface 11a of the semiconductor substrate 11. Then, first, as shown in FIG. 2A, a curable resin 140 is applied onto the front surface 11a of the semiconductor substrate 11. The curable resin 140 can be also referred to as an adhesive agent. The curable resin 140 is, for example, a thermosetting resin or an ultraviolet curable resin.

The curable resin 140 may be applied by spin coating, spiral coating, printing, or the like. The thickness of the curable resin 140 may be 50 μm or more from the viewpoint of reinforcing the semiconductor substrate 11 so as to withstand processing and conveyance.

Then, after the curable resin 140 is applied, the supporter 14 is obtained by curing the curable resin 140. If the curable resin 140 is a thermo-setting resin, the curable resin 140 may be cured by heating. If the curable resin 140 is an ultraviolet curable resin, the curable resin 140 may be cured by ultraviolet radiation.

Next, as shown in FIG. 2B, the electrically-conductive film 15 is formed on the surface of the supporter 14, and, subsequently, the protective film 16 is formed on the surface of the electrically-conductive film 15. As a result, the laminated body 1 of FIG. 1 is obtained.

Then, as shown in FIG. 2C, the semiconductor substrate 11 is thinned. In thinning, the laminated body 1 is electrostatically chucked by an unshown polishing device via the electrically-conductive film 15. Then, the back surface 11b of the semiconductor substrate 11 is ground by a polisher (grinding stone) of the polishing device. Note that, as shown in FIG. 2C, the back surface 11b of the semiconductor substrate 11 may be polished to a position at the same height as a surface 141a of the end 141 of the supporter 14.

In thinning, a polishing pressure in a thickness direction D1 works on the semiconductor substrate 11. In the present embodiment, since the semiconductor substrate 11 is reinforced by the supporter 14, damage of the semiconductor substrate 11 due to the polishing pressure can be suppressed. Moreover, since the end 141 of the supporter 14 covers the lateral surface 11c of the semiconductor substrate 11, generation of burrs at the end of the semiconductor substrate 11 can be suppressed.

Figure 3A:
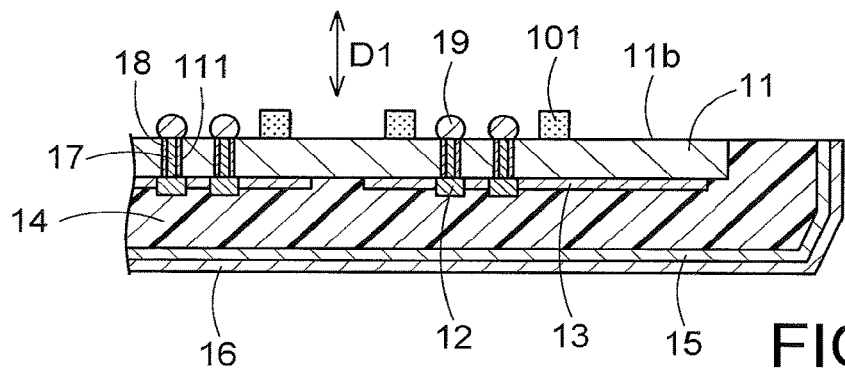
FIG. 3A to FIG. 3D are schematic cross-sectional views of the semiconductor manufacturing method subsequent to FIG. 2.
Figure 3B:
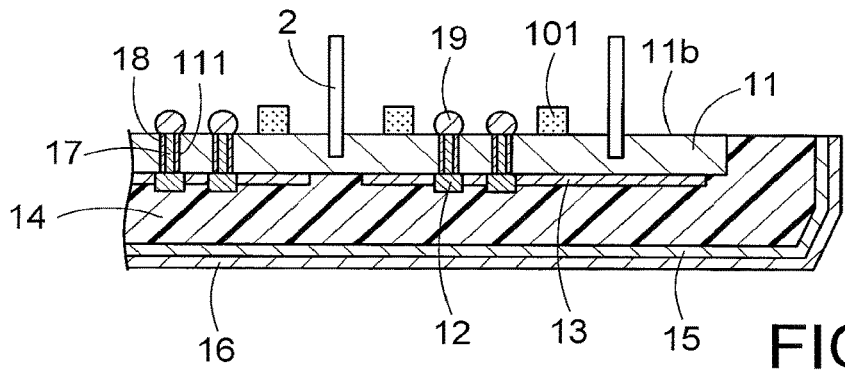
Figure 3C:
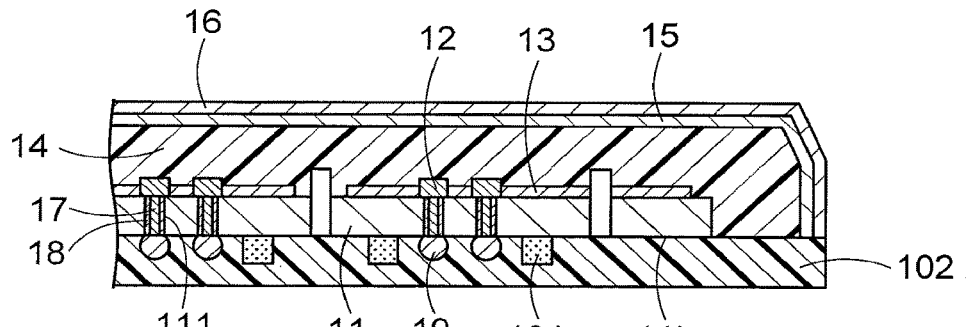
Figure 3D:
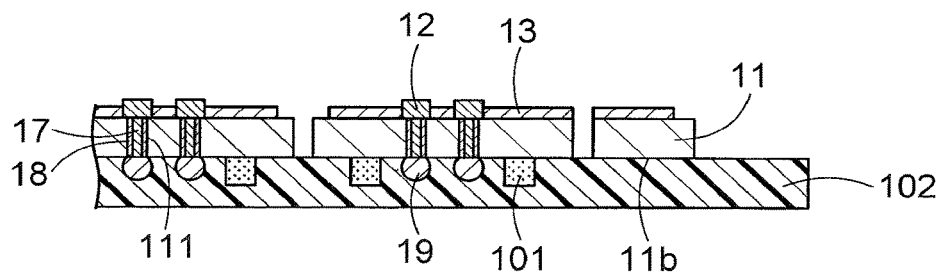

FIG. 3A to FIG. 3D are schematic cross-sectional views of the semiconductor manufacturing method subsequent to FIG. 2. Specifically, FIG. 3A is a drawing showing a step of forming the through silicon vias (TSV) 17, etc. FIG. 3B is a drawing showing a dicing step. FIG. 3C is a drawing showing a step of pasting a support tape. FIG. 3D is a drawing showing a step of removing the supporter 14.

After the thinning step (FIG. 2C), as shown in FIG. 3A, the through silicon vias 17 penetrating through the semiconductor substrate 11 in the thickness direction D1 are formed. In formation of the through silicon vias 17, first, via holes 111 (through holes) penetrating through the semiconductor substrate 11 in the thickness direction D1 are formed. The via holes 111 are formed at the positions corresponding to the pad electrodes 12. The via holes 111 may be formed by, for example, reactive ion etching (RIE).

Then, a barrier metal 18 is formed on inner peripheral walls of the via holes 111. The barrier metal 18 may be, for example, Ti or the like. Moreover, the barrier metal 18 may be formed by, for example, dry etching.

Then, the through silicon vias 17, which bury the via holes 111, are formed. The through silicon vias 17 are in contact with the pad electrodes 12 at lower ends. The through silicon vias 17 may be, for example, Ni or the like. Moreover, the through silicon vias 17 may be formed by, for example, a plating process such as electroplating or non-electrolytic plating.

Then, although it is not shown in the drawing, wiring electrodes are formed on the back surface 11b of the semiconductor substrate 11. Moreover, solder bumps 19 are formed on the back surface 11b of the semiconductor substrate 11. The solder bumps 19 are used in three-dimensional packaging of the individually-separated semiconductor substrate 11 (chip). Specifically, the solder bumps 19 are electrically connected to electrodes (through silicon vias, etc.) of a chip in an upper layer. The solder bumps 19 may be, for example, Sn or the like. Moreover, an adhesive agent 101 is formed on the back surface 11b of the semiconductor substrate 11. The adhesive agent 101 can be used for improving the force to join with the chip in the upper layer in a case of three-dimensional packaging of the chip. The adhesive agent 101 may be, for example, a photosensitive polyimide resin or the like.

Then, as shown in FIG. 3B, the semiconductor substrate 11 is diced. In dicing, in order to individually separate (divide) the semiconductor substrate 11 into chips, the semiconductor substrate 11 is cut in the thickness direction D1 by dicing blades 2. In dicing, shear stress in the thickness direction D1 works on the semiconductor substrate 11. In the present embodiment, since the semiconductor substrate 11 is reinforced by the supporter 14, damage of the semiconductor substrate 11 due to the shear stress of dicing can be suppressed.

If the semiconductor substrate 11 is pasted onto a soft dicing tape to carry out dicing, defects (chipping) of the device which adheres to the dicing tape are easily generated.

On the other hand, in the present embodiment, chipping can be suppressed by carrying out dicing while reinforcing the semiconductor substrate 11 by the supporter 14.

Then, as shown in FIG. 3C, a support tape 102 is pasted on the back surface 11b of the semiconductor substrate 11. The support tape 102 can be used for protecting the electrodes, which are formed on the back surface 11b, in a case of removal of the supporter 14. The support tape 102 is desirably a material in which the electrodes formed on the back surface 11b of the semiconductor substrate 11 can be buried.

Then, as shown in FIG. 3D, the pad electrodes 12 are exposed by removing the supporter 14. Removal of the supporter 14 may be carried out by mechanical polishing or etching using a solvent. When the supporter 14 is removed, the semiconductor substrate 11 can be individually separated into pieces having chip sizes.

If a supporting substrate made of glass or made of silicon is used, cost for building an environment and a process to reuse the supporting substrate is taken. Moreover, after the semiconductor substrate is peeled off from the supporting substrate, labor to remove an adhesive agent adhering to the semiconductor substrate is taken. Moreover, if the adhesive agent is removed by peeling, the yield is deteriorated due to generation of an adhesive-agent residue. Moreover, if the adhesive agent is removed by cleaning using a solvent, since the usage amount of the solvent is large, cost is taken, and cleaning time becomes long.

On the other hand, in the present embodiment, since the supporter 14 can be manufactured by the inexpensive curable resin, material cost can be reduced. Moreover, in the present embodiment, since there is no need to remove the adhesive agent other than the supporter 14, manufacturing man hours and cost can be reduced.

Figure 4A:
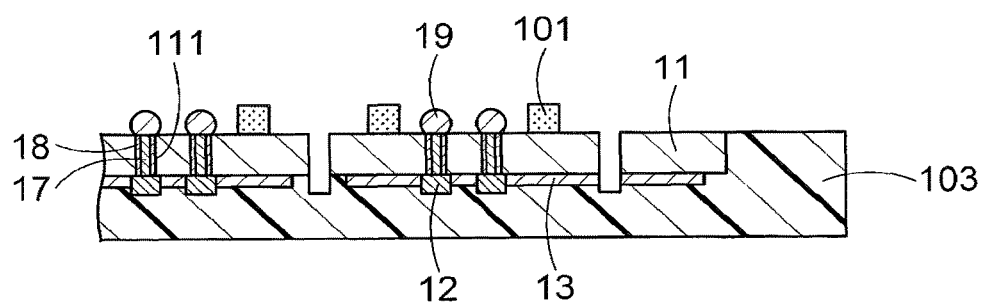
FIG. 4A and FIG. 4B are schematic cross-sectional views of the semiconductor manufacturing method subsequent to FIG. 3.
Figure 4B:
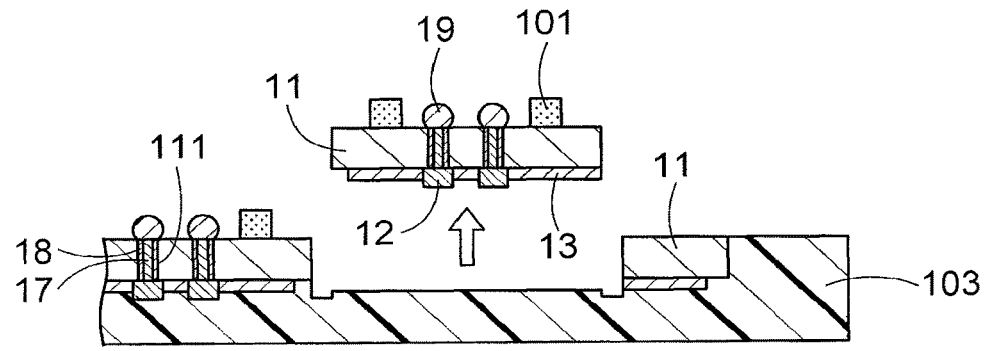

FIG. 4A and FIG. 4B are schematic cross-sectional views of the semiconductor manufacturing method subsequent to FIG. 3. Specifically, FIG. 4A is a drawing showing a step of replacing the tape. FIG. 4B is a drawing showing a step of picking-up the individually-separated semiconductor substrate 11.

After the step of removing the supporter 14 (FIG. 3D), as shown in FIG. 4A, the support tape 102 is replaced by a pickup tape 103.

Then, as shown in FIG. 4B, the individually-separated semiconductor substrate 11 is picked up from the pickup tape 103. Pickup may be carried out by, for example, a vacuum chuck. Then, the picked-up semiconductor substrate 11 is three-dimensionally packaged via the through silicon vias 17 together with another semiconductor substrate 11.

Note that, after the supporter 14 is formed, the surface of the supporter 14 may be planarized. Planarization may be carried out by CMP (Chemical Mechanical Polishing). Since the surface of the supporter 14 is planarized, in the thinning step, the back surface 11b (grinding target surface) of the semiconductor substrate 11 can be horizontally maintained at the polishing device. Since the back surface 11b of the semiconductor substrate 11 can be horizontally maintained, thickness uniformity of the semiconductor substrate 11 after thinning can be improved. Since the thickness uniformity of the semiconductor substrate 11 is improved, processing accuracy of the via holes 111 can be improved, and the through silicon vias 17 can be appropriately formed. As a result, the yield can be further improved.

The present embodiment can be also applied, for example, for manufacturing a NAND flash memory. Moreover, the present embodiment can be widely applied to semiconductor manufacturing processes including a thinning step and can be also applied to, for example, a process in which the through silicon vias are not formed.

As explained above, according to the present embodiment, by using the supporter 14 containing the resin, thinning of the semiconductor substrate can be carried out at low cost while ensuring productivity.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor manufacturing method comprising:
   forming a supporter on a second surface of a semiconductor substrate opposite to a first surface to be ground of the semiconductor substrate;
   thinning a thickness of the semiconductor substrate by grinding the first surface; and
   forming an electrically-conductive film on the supporter, the supporter comprising a resin.

2. The semiconductor manufacturing method according to claim 1, wherein
   a lateral surface of the semiconductor substrate is coated by the supporter.

3. The semiconductor manufacturing method according to claim 1, wherein
   forming the supporter on the second surface via a passivation film.

4. The semiconductor manufacturing method according to claim 1, comprising
   forming a protective film on the electrically conductive film.

5. The semiconductor manufacturing method according to claim 1, wherein
   forming the supporter comprises:
   applying a curable resin onto the second surface; and
   curing the curable resin.

6. The semiconductor manufacturing method according to claim 5, comprising
   cutting the semiconductor substrate in a thickness direction after thinning the thickness of the semiconductor substrate.

7. The semiconductor manufacturing method according to claim 5, wherein a lateral surface of the semiconductor substrate is coated by the supporter.

8. The semiconductor manufacturing method according to claim 5, wherein
   forming the supporter comprises planarizing a surface of the curable resin after curing the curable resin.

9. The semiconductor manufacturing method according to claim 8, comprising
   cutting the semiconductor substrate in a thickness direction after thinning the thickness of the semiconductor substrate.

10. The semiconductor manufacturing method according to claim 8, wherein a lateral surface of the semiconductor substrate is coated by the supporter.

11. The semiconductor manufacturing method according to claim 1, comprising
cutting the semiconductor substrate in a thickness direction after thinning the thickness of the semiconductor substrate.

12. The semiconductor manufacturing method according to claim 11, wherein a lateral surface of the semiconductor substrate is coated by the supporter.

13. The semiconductor manufacturing method according to claim 11, comprising:
between thinning of the thickness of the semiconductor substrate and cutting of the semiconductor substrate in the thickness direction,
forming a through hole penetrating through the semiconductor substrate in the thickness direction; and
forming a first electrode burying the penetrating hole.

14. The semiconductor manufacturing method according to claim 13, comprising:
forming, on the second surface, a second electrode connected to the first electrode before forming the supporter; and
exposing the second electrode by removing the supporter after cutting the semiconductor substrate in the thickness direction.

15. The semiconductor manufacturing method according to claim 13, wherein
a lateral surface of the semiconductor substrate is coated by the supporter.

16. A laminated body comprising:
a semiconductor substrate; and
a supporter disposed on a second surface of the semiconductor substrate opposite to a first surface to be ground of the semiconductor substrate, wherein
a first portion of a lateral surface of the semiconductor substrate located on the second surface side is coated by the end of the supporter,
a second portion of the lateral surface of the semiconductor substrate located on the first surface side is not coated by the end of the supporter, and
the end of the supporter projects toward the first surface of the semiconductor substrate to coat the first portion of the lateral surface of the semiconductor substrate.

17. The laminated body according to claim 16, wherein the supporter comprises a resin.

18. The laminated body according to claim 16, comprising
an electrically-conductive film on the supporter.

19. The laminated body according to claim 18, comprising
a protective film on the electrically-conductive film.

* * * * *